United States Patent
Boesch et al.

[11] Patent Number: 5,969,582
[45] Date of Patent: Oct. 19, 1999

[54] IMPEDANCE MATCHING CIRCUIT FOR POWER AMPLIFIER

[75] Inventors: Ronald D. Boesch, Morrisville; Kevin P. Conroy, Apex, both of N.C.

[73] Assignee: Ericsson Inc., Research Triangle Park, N.C.

[21] Appl. No.: 08/888,168

[22] Filed: Jul. 3, 1997

[51] Int. Cl.$^6$ .......................................................... H03H 7/46
[52] U.S. Cl. ............................ 333/129; 333/132; 333/175
[58] Field of Search .................................... 333/129, 132, 333/175

[56] References Cited

U.S. PATENT DOCUMENTS

| | | | |
|---|---|---|---|
| 2,247,898 | 7/1941 | Wheeler et al. | 333/175 X |
| 3,332,038 | 7/1967 | Stanley et al. | 333/129 |
| 4,085,405 | 4/1978 | Barlow | 333/129 |
| 5,060,294 | 10/1991 | Schwent et al. | 455/93 |
| 5,258,728 | 11/1993 | Taniyoshi et al. | 333/132 |
| 5,438,684 | 8/1995 | Schwent et al. | 455/89 |

FOREIGN PATENT DOCUMENTS

| | | |
|---|---|---|
| 0744831 | 11/1966 | European Pat. Off. . |
| 55-149518 | 11/1980 | Japan ..................................... 333/132 |
| WO9710621 | 3/1997 | WIPO . |

OTHER PUBLICATIONS

Crowhurst, "3–Way Crossover Design", Radio–Electronics, pp. 137–143, Jan. 1957.
PCT International Search Report for International Application No. PCT/US98/12971 dated Oct. 30, 1998.
Wheeler, et al. "A Solid State Amplifier for Satellite Communications," Microwave Journal, vol. 18, No. 7, Jul. 1975 pp. 52–55.

*Primary Examiner*—Justin P. Bettendorf
*Attorney, Agent, or Firm*—David C. Hall; Kevin A. Sembrat

[57] ABSTRACT

An impedance matching circuit for a multi-band power amplifier has an input port for receiving RF signals from an amplifier, a first path for communicating RF signals in a first frequency band to a first output port, and at least one second path for communicating RF signals in a second frequency band to a second output port. The first path includes impedance matching circuitry for matching the impedance of the first output port and the input port in the first frequency band, and the second path includes impedance matching circuitry for matching the impedance of the second output port and the input port in the second frequency band. The first path contains circuitry which blocks RF signals in the second frequency band, and the second path contains circuitry which blocks RF signals in the first frequency band. A multiband power amplifier includes a multi-band amplifier coupled with an impedance matching circuit for a multiband power amplifier.

8 Claims, 5 Drawing Sheets

IMPEDANCE MATCHING CIRCUIT FOR POWER AMPLIFIER

BACKGROUND OF THE INVENTION

1. Field of Invention

The present invention relates generally to impedance matching circuits for power amplifiers. More specifically, the present invention relates to an impedance matching circuit for multiple band power amplifiers.

2. Description of Related Art

In the United States, cellular operating licenses have been awarded by the Federal Communication Commission (FCC) pursuant to a licensing scheme which divides the country into geographic service markets. Two cellular licenses were awarded for operating systems in each market. These two systems were initially allocated two different radio frequency (RF) blocks in the 800 MHz range. To meet the needs of a growing number of mobile subscribers, the FCC subsequently released additional blocks of spectrum in the 800 MHz range.

Despite the increase in available spectrum, demand for cellular services has continued to outpace supply. Moreover, the use of analog technology limited the capacity gains that could be achieved by conventional techniques such as cell-splitting. In response, a number of digital air interface standards were developed for providing efficient digital communication of voice, data, fax and text messages under the umbrella of "personal communications services" or PCS.

The FCC recently auctioned spectrum in the 1900 MHz range for use by PCS systems. Six frequency bands have been specified within the 1900 MHz range, with each band divided into duplex channels spaced by 30 KHz in a manner similar to the channel allocation for the 800 MHz range used by cellular systems.

Operational PCS systems are now beginning to appear in the United States. Meanwhile, existing cellular systems are continuing to operate. Thus, in many markets, there are now cellular systems operating in the 800 MHz range and PCS systems operating in the 1900 MHz range. Mobile subscribers who desire to receive services from both types of systems must either use two different mobile transceivers capable of operating within the cellular band and the PCS band, respectively, or, preferably, use a single "dual band" mobile transceiver which can operate in both bands. Moreover, with the advent of personal satellite communications, it is likely that in the future a mobile subscriber will wish to receive services from three or more systems using different frequency bands.

One approach to designing a multi-band mobile transceiver, such as a dual band transceiver, is to use completely separate radio hardware for the cellular band and the PCS band, respectively. However, this approach would increase the size and cost of the mobile transceiver. To minimize the size and cost of a dual band mobile transceiver, as much of the hardware used for operation in the cellular band should be reused for operation in the PCS band.

In particular, it is desirable to include only one amplifier in the dual band transceiver for amplification of RF signals in both the cellular band and the PCS band. Otherwise, two separate amplifier chains are required, which may be both expensive and inefficient.

There is a problem if only one amplifier is used, however. For the amplifier to act as an efficient power amplifier, the impedance at the output of the amplifier must be power matched to the impedance of the antenna prior to transmission. One possible solution to this problem is to provide the amplifier with separate, switched high-pass and low-pass matching networks at its output. However, the switch must be capable of handling high power, which tends to require a large, costly switch.

Another solution is to provide a broadband power matching circuit covering both desired frequency bands and having peaks at the transmit bands. Such a configuration would tend to waste bandwidth, however, when the desired match frequencies differ by an octave or more and the desired bandwidth in each band is relatively narrow. The well known Fano's Limit shows that there is a physical limitation on broadband matching when a reactive element (such as the drain-source capacitance of a transistor) is present.

Therefore, there is a need in the art for an improved matching circuit for providing a power match for a multi-band power amplifier.

SUMMARY OF THE INVENTION

It is, therefore, an object of the present invention to provide an improved impedance matching circuit for a multi-band power amplifier.

It is a further object of the present invention to provide an impedance matching circuit for a multi-band power amplifier that is efficient, reliable and cost-effective.

It is a further object of the present invention to provide an impedance matching circuit for a multi-band power amplifier that provides a good match across a wide range of frequencies.

The foregoing objects are accomplished in an impedance matching circuit for a multi-band power amplifier. The matching circuit has an input port for receiving RF signals from an amplifier, a first path for communicating RF signals in a first frequency band to a first output port, and at least one second path for communicating RF signals in a second frequency band to a second output port. The first path may include impedance matching circuitry for matching the impedance of the first output port and the input port in the first frequency band, and the second path may include impedance matching circuitry for matching the impedance of the second output port and the input port in the second frequency band. The first path may contain circuitry which blocks RF signals in the second frequency band, and the second path may contain circuitry which blocks RF signals in the first frequency band. In one aspect of the invention, at least one reactive circuit element in the first path may contribute to the impedance match of the second path, and vice versa.

The impedance matching circuit of the present invention may be employed in conjunction with a multiband amplifier to provide an improved power amplifier.

These and other objects of the invention, together with features and advantages thereof will become apparent from the following detailed specification when read with the accompanying drawings in which like reference numerals refer to like elements.

DETAILED DESCRIPTION OF THE PREFERRED EMBODIMENTS

The present invention will now be described with reference to the accompanying drawings, in which preferred embodiments of the invention are shown. However, this invention may be embodied in many different forms and should not be construed as limited to the specific embodiments shown. Rather, the preferred embodiments are provided so that this disclosure is thorough and complete, and will fully convey the scope of the invention to those skilled in the art.

Figure 1:
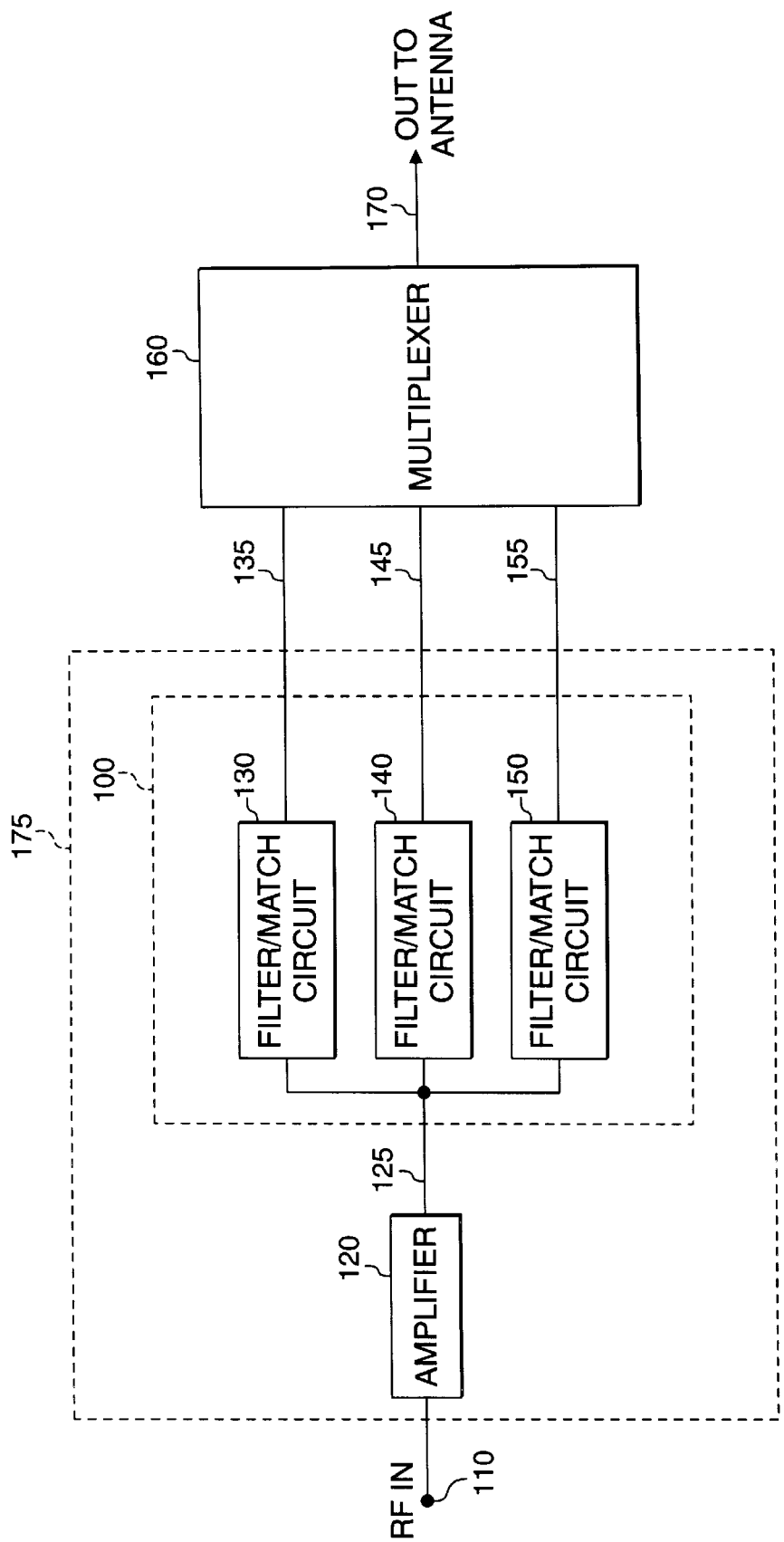
FIG. 1 is a block diagram of an embodiment of the present invention.

Referring now to FIG. 1, a power amplifier 175 having a matching circuit 100 for a multi-band power amplifier is shown in block diagram form. Radio Frequency (RF) signals are input to a multi-band amplifier 120 at RF input port 110. Amplifier 120 amplifies the RF signals and outputs the amplified RF signals to a power matching circuit 100 at port 125.

In the embodiment shown in FIG. 1, the amplified RF signals may fall into one of three frequency bands. However, it will be readily apparent to one skilled in the art that the present invention could modified for use in connection with a power amplifier capable of amplifying RF signals contained in more than three frequency bands.

RF signals falling in the first frequency band will be passed by filter/match circuit 130 to multiplexer 160 at port 135. Likewise, RF signals falling in the second frequency band will be passed by filter/match circuit 140 to multiplexer 160 at port 145, and RF signals falling in the third frequency band will be passed by filter/match circuit 150 to multiplexer 160 at port 155.

Filter/match circuit 130 blocks RF signals in the second and third frequency bands while providing an impedance match for signals in the first frequency band. Likewise, filter/match circuit 140 blocks RF signals in the first and third frequency bands while providing an impedance match for signals in the second frequency band. Finally, filter/match circuit 150 blocks RF signals in the first and second frequency bands while providing an impedance match for signals in the third frequency band.

Figure 2:
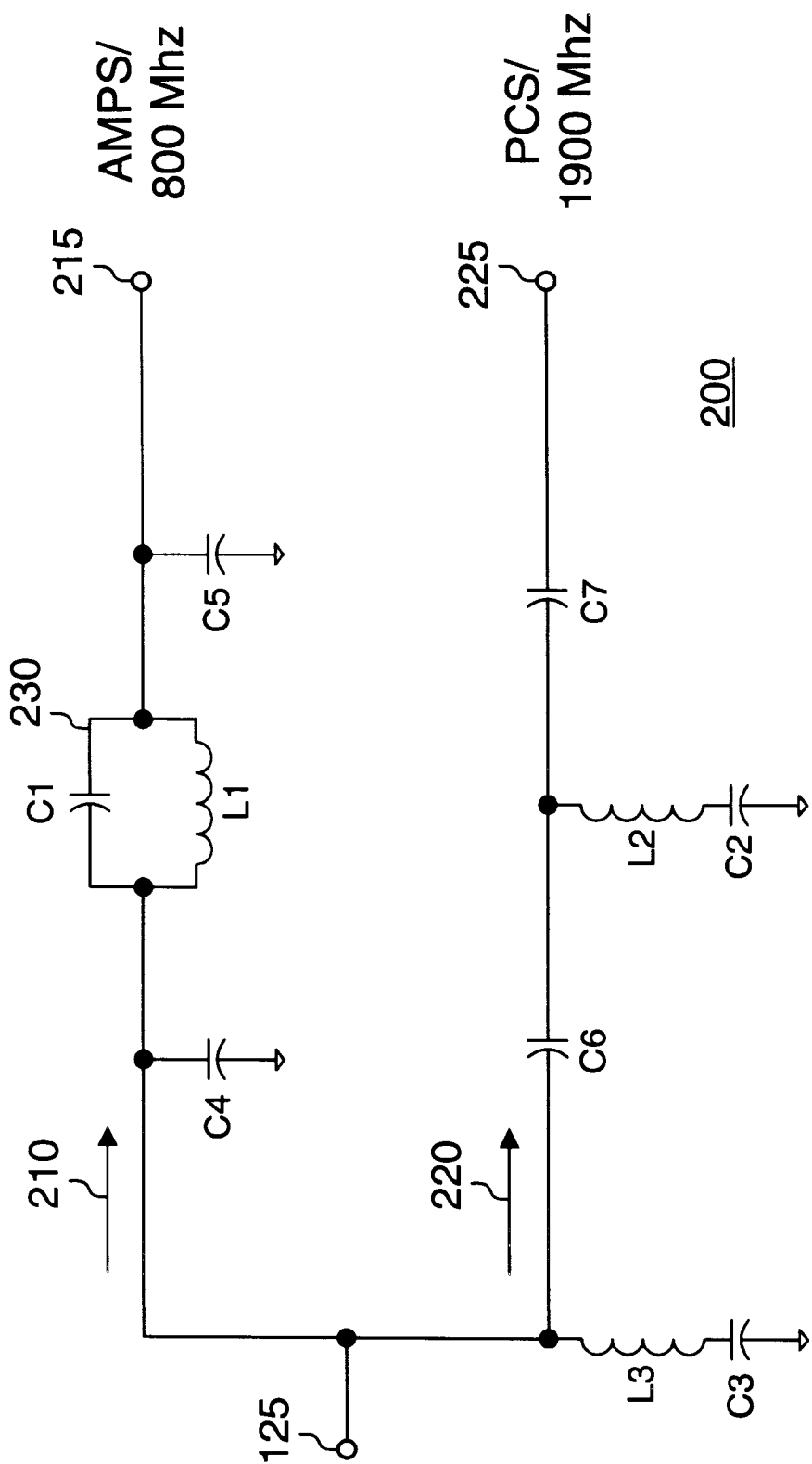
FIG. 2 is a circuit diagram of an embodiment of the present invention.

FIG. 2 illustrates an embodiment of the present invention in the case of a power amplifier which amplifies RF signals in the 800 MHz (cellular or AMPS) range and the 1900 MHz (PCS) range. A diplex power matching circuit 200 has a first path 210 for communicating RF signals in the AMPS band to an output port 215 and a second path 220 for communicating RF signals in the PCS band to output port 225.

Path 210 includes a parallel resonant circuit 230 including inductor L1 and capacitor C1. Circuit values for inductor L1 and capacitor C1 are selected such that parallel resonant circuit 230 presents substantially a parallel resonant open circuit to RF signals in the PCS transmit band, thus insuring that no RF energy in the PCS band will be transmitted to output port 215. The resonant open circuit provided by circuit 230 at PCS band frequencies also insures that the load connected at port 215 does not affect the impedance presented to port 125 by the PCS band matching circuit of path 220. Essentially, circuit 230 provides path 210 with a bandstop null at a predetermined frequency near or within the PCS transmit band. For most applications, the bandstop null should occur at a frequency within about 20% of a frequency in the PCS transmit band, depending on design considerations.

In the AMPS band, circuit 230 appears substantially as a series inductance. This series inductance, coupled with the capacitance provided by capacitors C4 and C5, provides a low pass matching network to provide a 50 Ohm impedance match to the desired power load at AMPS band frequencies.

In path 220, the inductor L2 and capacitor C2 form a series resonant circuit that presents substantially a short circuit at AMPS transmit band frequencies. This provides a high reflection to AMPS band transmit frequencies, insures that no AMPS band energy is transmitted to output port 225, and also insures that the load connected at port 225 does not affect the impedance presented to port 125 by the AMPS band matching circuit of path 210.

In the AMPS band, the resonant circuit formed by inductor L2 and capacitor C2 grounds capacitor C6, so that capacitor C6 appears in the AMPS band to provide a parallel capacitance to capacitor C4. This contributes to the low pass match of path 210. Essentially, then, inductor L2 and capacitor C2 provide path 220 with a bandstop null at a predetermined frequency near or within the AMPS transmit band. For most applications, the bandstop null should occur at a frequency within about 20% of a frequency in the AMPS transmit band, depending on design considerations.

In the PCS band, the resonant circuit formed by inductor L2 and capacitor C2 appears as a shunt inductor to ground. This shunt inductor, in combination with series capacitors C6 and C7, forms a high pass matching network which provides a 50 Ohm impedance match to the desired power load at PCS band frequencies.

The circuit formed by capacitor C3 and inductor L3 is series resonant at the second harmonic of AMPS transmit band frequencies. By presenting a purely reactive (i.e. non-resistive) load to the second harmonic of the AMPS band transmit frequencies, path 220 provides maximum reflection of the second harmonic of AMPS band frequencies without degrading amplifier efficiency. This prevents leakage of the second harmonic energy through path 220 to the antenna, ensuring compliance with FCC regulations on harmonic energy levels.

The circuit consisting of inductor L3 and capacitor C3 appears as a shunt capacitor to ground in the AMPS band; thus, in AMPS mode, inductor L3 and capacitor C3 provide a parallel capacitance to capacitor C4. The circuit values of inductor L3 and capacitor C3 are chosen and optimized to minimize any impact to signals in the PCS band. Specifically, the values of L3 and C3 are chosen to minimize insertion loss in the PCS band.

Figure 3:
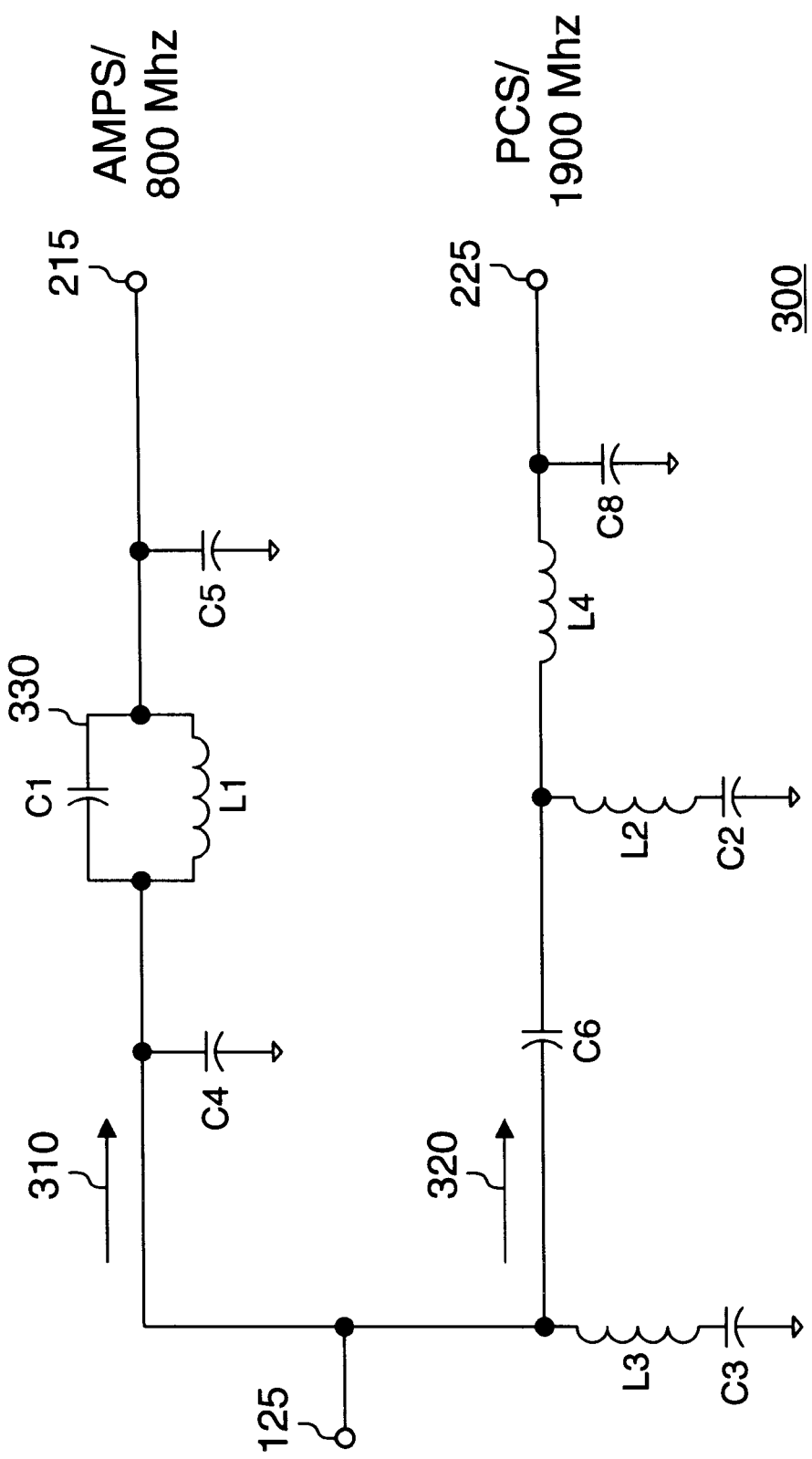
FIG. 3 is a circuit diagram of another embodiment of the present invention.

A second embodiment of the present invention is illustrated in FIG. 3. Path 310 is identical to path 210 shown in FIG. 2. Path 320 is substantially similar to path 220 shown in FIG. 2, except that series capacitor C7 has been replaced with the combination of series inductor L4 and shunt capacitor C8. In doing this, the final segment of the PCS band match has been changed from a high pass structure to a low pass structure. The behaviors of both the series resonant circuit formed by inductor L2 and capacitor C2, and the "second harmonic trap" formed by inductor L3 and capacitor C3, are identical to the previous descriptions associated with FIG. 2.

Figure 4:
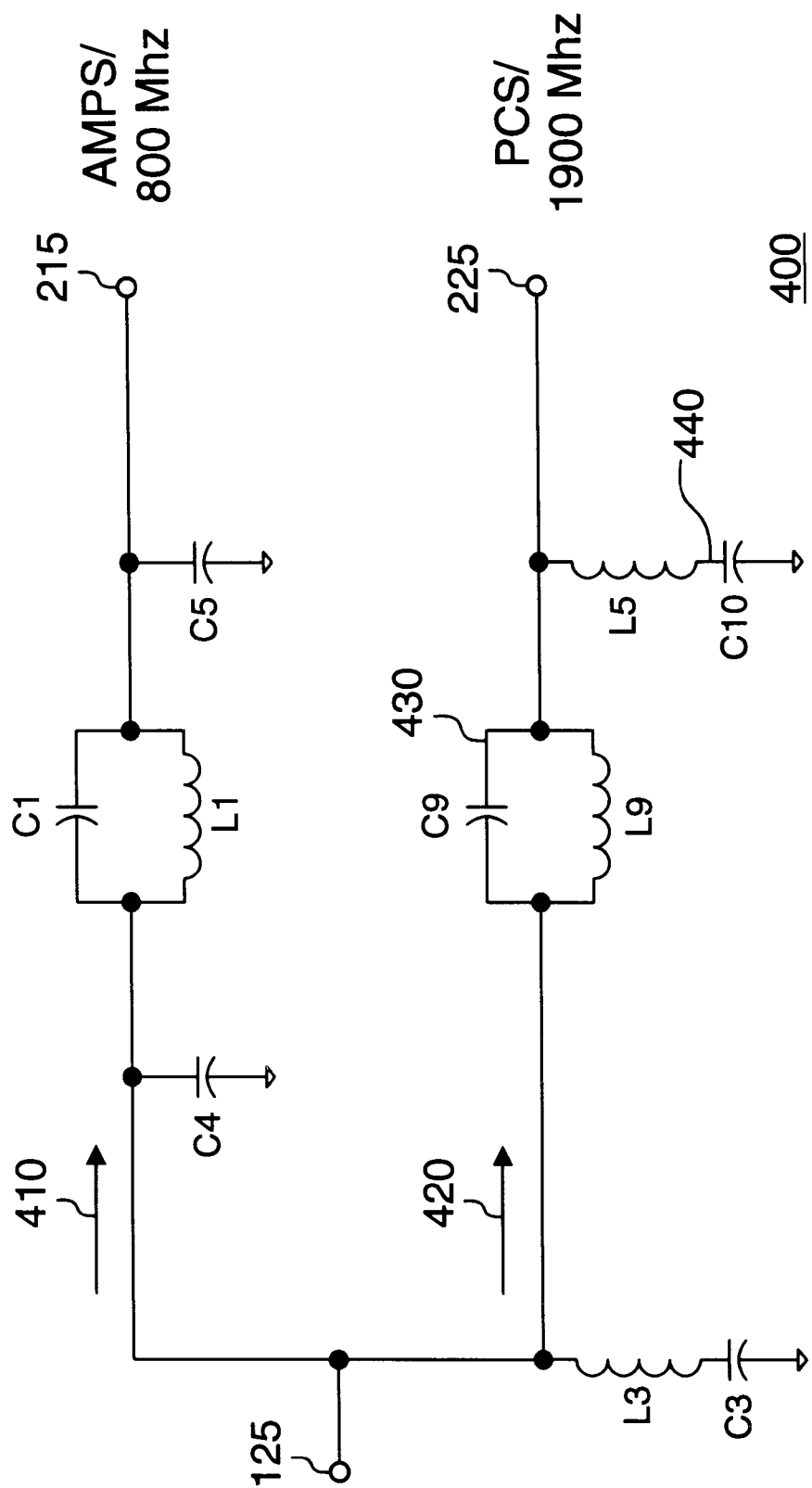
FIG. 4 is a circuit diagram of a third embodiment of the present invention.

A third embodiment of the present invention is illustrated in FIG. 4. Path 410 is identical to path 210 shown in FIG. 2. Path 420 includes shunt circuit 440 comprising inductor L5 and capacitor C10, and parallel resonant circuit 430 formed by inductor L9 and capacitor C9. Circuit 430 presents a parallel resonant open circuit, and therefore a high reflection to RF energy, in the AMPS transmit band. This ensures that no AMPS band energy is transmitted to output port 225, and also ensures that the load connected at port 225 does not affect the impedance presented to port 125 by the AMPS band matching circuit of path 410. In the PCS band, circuit 430 appears as a series capacitor.

The series combination of inductor L5 and capacitor C10 is not intended to achieve a specific resonant frequency, but rather is designed to appear as a shunt inductor with a DC blocking capacitor at PCS transmit band frequencies. This "shunt inductor", in combination with the "series capacitor" of circuit 430, yields a high pass structure which provides a 50 Ohm impedance match at Port 225 in the PCS band.

[It should also be noted that, if appropriate element values are available, the resonant frequency of the series combination of inductor L5 and capacitor C10 could be chosen to provide additional reflection of AMPS transmit band frequencies, while simultaneously providing the desired amount of shunt inductance at PCS transmit band frequencies.]

Once again, the series resonant circuit formed by inductor L3 and capacitor C3 acts as a "second harmonic trap", with behavior identical to the description of the second harmonic trap in FIG. 2.

Figure 5:
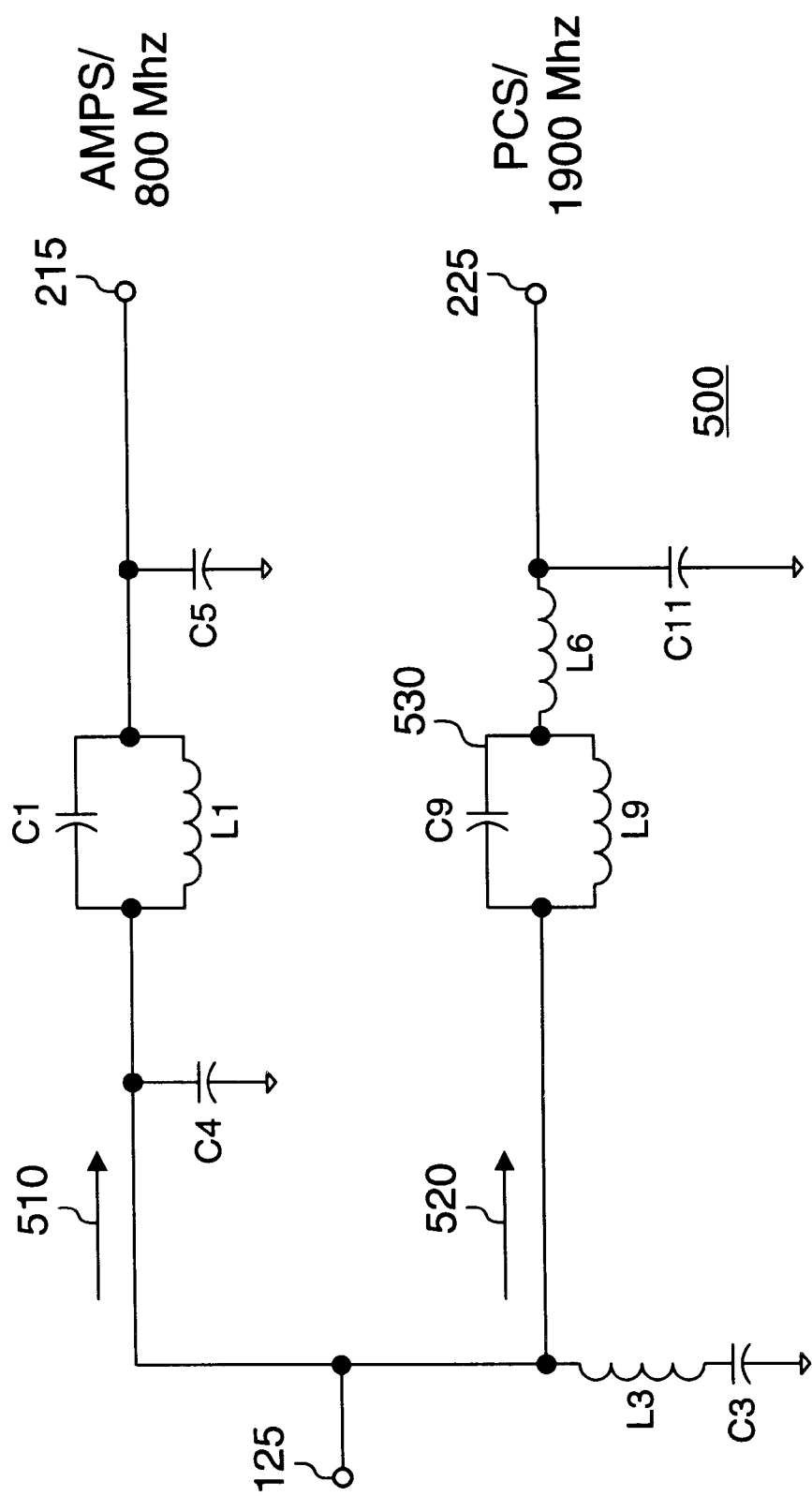
FIG. 5 is a circuit diagram of a fourth embodiment of the present invention.

The final embodiment to be described here is shown in FIG. 5. Path 510 is identical to path 210 shown in FIG. 2. Path 520 is substantially similar to path 420 shown in FIG. 4, with the exception that the series combination (to ground) of inductor L5 and capacitor C10 has been replaced with the combination of series inductor L6 and shunt capacitor C11. In doing this, the final segment of the PCS band match has been changed from a high pass structure to a low pass structure. The behavior of both the parallel resonant circuit formed by inductor L9 and capacitor C9, and the "second harmonic trap" formed by inductor L3 and capacitor C3, are identical to the previous descriptions associated with FIG. 4.

In a dual band mobile transceiver designed for use in a time division multiple access (TDMA) system, there may be a switch already included in the high frequency output path. In such an event, capacitor C3 and inductor L3 may be omitted, since the switch would reflect AMPS band harmonics.

The present invention could be readily extended to provide a power match for more than two frequency bands by including second bandstop filter in each transmission path.

While the present invention has been described with respect to its preferred embodiment, those skilled in the art will recognize that the present invention is not limited to the specific embodiment described and illustrated herein. Different embodiments and adaptations besides those shown herein and described as well as many variations, modifications and equivalent arrangements will now be apparent or will be reasonably suggested by the foregoing specification and drawings, without departing from the substance or scope of the invention. Accordingly, it is intended that the invention be limited only by the spirit and scope of the claims appended hereto.

A diplex power matching circuit for a multi-band power amplifier is disclosed. The power matching circuit is particularly suited for use in a dual band mobile transceiver.

What is claimed is:

1. An impedance matching circuit, comprising:
an input port for receiving RF signals in at least a first frequency band and a second frequency band, a first output port, and a second output port;
a first path for communicating RF signals in the first frequency band to said first output port; and
a second path for communicating RF signals in the second frequency band to a second output port;
wherein said first path includes first means for blocking RF signals in the second frequency band from being communicated to said first output port and for matching the impedance between said input port and said first output port for RF signals in the first frequency band; and
wherein said first path includes a reactive element which contributes to the impedance match of RF signals in said second frequency band;
wherein said first blocking means comprises a parallel resonant circuit tuned to present a substantially open circuit to RF signals at a predetermined frequency in said second frequency band; and
a shunt circuit including a capacitor and an inductor, said shunt circuit coupled to said first output port, wherein said parallel resonant circuit, and said shunt circuit operatively form an impedance matching network for RF signals in said first frequency band.

2. An impedance matching circuit, comprising:
an input port for receiving RF signals in at least a first frequency band and a second frequency band, a first output port, and a second output port;
a first path for communicating RF signals in the first frequency band to said first output port; and
a second path for communicating RF signals in the second frequency band to a second output port;
wherein said first path includes first means for blocking RF signals in the second frequency band from being communicated to said first output port and for matching the impedance between said input port and said first output port for RF signals in the first frequency band; and
wherein said first path includes a reactive element which contributes to the impedance match of RF signals in said second frequency band;
wherein said second path includes second means for blocking RF signals in the first frequency band from being communicated to said second output port; and
wherein said first blocking means comprises a parallel resonant circuit selected to present an open circuit to signals in said second frequency band and said second blocking means includes a parallel resonant circuit selected to present substantially an open circuit to signals in said first frequency band, for blocking signals in said second frequency band from being communicated to said first output port and for blocking signals in said first frequency band from being communicated to said second output port, respectively.

3. An impedance matching circuit, comprising:
an input port for receiving RF signals in at least a first frequency band and a second frequency band a first output port, and a second output port;
a first path for communicating RF signals in the first frequency band to said first output port; and
a second path for communicating RF signals in the second frequency band to a second output port;
wherein said first path includes first means for blocking RF signals in the second frequency band from being communicated to said first output port and for matching the impedance between said input port and said first output port for RF signals in the first frequency band; and wherein said first path includes a reactive element which contributes to the impedance match of RF signals in said second frequency band;

wherein said second path includes second means for blocking RF signals in the first frequency band from being communicated to said second output port;

wherein said first blocking means comprises a series resonant circuit selected to present substantially a short circuit to signals in said second frequency band and said second blocking means comprises a parallel resonant circuit selected to present substantially an open circuit to signals in said first frequency band, for blocking signals in said second frequency band from being communicated to said first output port and for blocking signals in said first frequency band from being communicated to said second output port, respectively; and wherein said first path further comprises a series inductor and a shunt capacitor selected to provide a high pass filter network.

4. An impedance matching circuit, comprising:

an input port for receiving RF signals in at least a first frequency band and a second frequency band, a first output port, and a second output port;

a first path for communicating RF signals in the first frequency band to said first output port; and a second path for communicating RF signals in the second frequency band to a second output port;

wherein said first path includes first means for blocking RF signals in the second frequency band from being communicated to said first output port and for matching the impedance between said input port and said first output port for RF signals in the first frequency band; and wherein said first path includes a reactive element which contributes to the impedance match of RF signals in said second frequency band;

wherein said first path comprises a low pass filter; and wherein said second path comprises a low pass filter.

5. An impedance matching circuit comprising:

an input port for receiving RF signals in at least a first frequency band and a second frequency band, a first output port, and a second output port;

a first path for communicating RF signals in the first frequency band to said first output port; and a second path for communicating RF signals in the second frequency band to a second output port;

wherein said first path includes first means for blocking RF signals in the second frequency band from being communicated to said first output port and for matching the impedance between said input port and said first output port for RF signals in the first frequency band; and wherein said first path includes a reactive element which contributes to the impedance match of RF signals in said second frequency band;

wherein said second path includes second means for blocking RF signals in the first frequency band from being communicated to said second output port; and wherein said second blocking means comprises a parallel resonant circuit selected to present an open circuit to signals in said first frequency band, said second path includes a shunt circuit having an impedance selected such that said shunt circuit appears as a shunt inductance to RF signals in said second frequency band, and wherein said parallel resonant circuit and said shunt circuit operatively form a high pass impedance matching network for RF signals in said second frequency band.

6. An impedance matching circuit comprising:

an input port for receiving RF signals in a first frequency band and a second frequency band, a first output port and a second output port;

a first path for communicating RF signals in the first frequency band to said first output port; and a second path for communicating RF signals in the second frequency band to said second output port;

wherein said first path comprises:
a parallel resonant circuit tuned to present substantially an open circuit to RF signals within said second frequency band and a series inductance to RF signals within said first frequency band,
a first shunt capacitor coupled to said input port, and
a second shunt capacitor coupled to said first output port;

wherein said parallel resonant circuit and said first and second shunt capacitors operatively form a low pass impedance matching network for RF signals in said first frequency range, and wherein said second path comprises:
a first series capacitor coupled to said input port,
a third shunt capacitor coupled to said second output port,
a first series inductor coupled to said second output port, and
a shunt series resonant circuit tuned to present a short circuit to RF signals in said first frequency band and a shunt inductance to RF signals in said second frequency band, said shunt series resonant circuit coupled between said first series capacitor and said first series inductor;

wherein said first series capacitor, said first and third shunt capacitors, said series inductor and said shunt series resonant circuit operatively form an impedance matching network for RF signals in said second frequency range; and wherein said first series capacitor operatively contributes to the impedance match of said low pass matching network for RF signals in said first frequency band.

7. An impedance matching circuit comprising:

an input port for receiving RF signals in a first frequency band and a second frequency band, a first output port and a second output port;

a first path for communicating RF signals in the first frequency band to said first output port; and a second path for communicating RF signals in the second frequency band to said second output port;

wherein said first path comprises:
a parallel resonant circuit tuned to present substantially an open circuit to RF signals within said second frequency band and a series inductance to RF signals within said first frequency band,
a first shunt capacitor coupled to said input port, and
a second shunt capacitor coupled to said first output port;

wherein said parallel resonant circuit and said first and second shunt capacitors operatively form a low pass impedance matching network for RF signals in said first frequency range, and wherein said second path comprises:
  a parallel resonant circuit tuned to present substantially an open circuit to RF signals within said first frequency band and a series capacitance to RF signals within said second frequency band, and
  a shunt circuit comprising an inductor and a capacitor coupled to said second output port;
wherein said first shunt capacitor, said shunt circuit and said parallel resonant circuit operatively form an impedance matching network for RF signals in said second frequency band.

8. An impedance matching circuit comprising:

an input port for receiving RF signals in a first frequency band and a second frequency band, a first output port and a second output port;

a first path for communicating RF signals in the first frequency band to said first output port; and a second path for communicating RF signals in the second frequency band to said second output port;

wherein said first path comprises:
  a first parallel resonant circuit tuned to present substantially an open circuit to RF signals within said second frequency band and a series inductance to RF signals within said first frequency band,
  a first shunt capacitor coupled to said input port, and
  a second shunt capacitor coupled to said first output port;
wherein said first parallel resonant circuit and said first and second shunt capacitors operatively form a low pass impedance matching network for RF signals in said first frequency range, and
wherein said second path comprises:
  a second parallel resonant circuit tuned to present substantially an open circuit to RF signals within said first frequency band and a series capacitance to RF signals within said second frequency band, and
  a series inductor coupled to said parallel resonant circuit and third shunt capacitor coupled to said second output port;
wherein said first and third shunt capacitors, said series inductor and said second parallel resonant circuit operatively form an impedance matching network for RF signals in said second frequency band.

* * * * *